United States Patent [19]

Paik et al.

[11] Patent Number: 5,418,002
[45] Date of Patent: May 23, 1995

[54] DIRECT BONDING OF COPPER TO ALUMINUM NITRIDE SUBSTRATES

[75] Inventors: Kyung W. Paik, Clifton Park; Constantine A. Neugebauer, Schenectady, both of N.Y.

[73] Assignee: Harris Corporation, Melbourne, Fla.

[21] Appl. No.: 632,876

[22] Filed: Dec. 24, 1990

[51] Int. Cl.[6] ............................................. B05D 5/12
[52] U.S. Cl. ..................... 427/96; 427/99; 427/123; 427/126.2; 427/126.3
[58] Field of Search ............ 228/122, 123, 124, 198, 228/263.18; 428/698, 472, 469, 336, 701, 702, 697; 427/126.2, 126.3, 123, 124, 99, 96

[56] References Cited

U.S. PATENT DOCUMENTS

| | | | |
|---|---|---|---|
| 3,766,634 | 10/1973 | Babcock et al. | 29/471.9 |
| 3,994,430 | 11/1976 | Cusano et al. | 228/122 |
| 4,163,074 | 7/1979 | Ebata et al. | 228/124 |
| 4,409,278 | 10/1983 | Jochym | 428/163 |
| 4,563,383 | 1/1986 | Kuneman et al. | 428/699 |
| 4,568,586 | 2/1986 | Gobrecht | 228/122 |
| 4,659,611 | 4/1987 | Iwase et al. | 428/209 |
| 4,849,292 | 7/1989 | Mizunoya et al. | 428/469 |
| 4,863,658 | 9/1989 | Sugiura et al. | 264/65 |
| 4,892,703 | 1/1990 | Iio et al. | 428/698 |

OTHER PUBLICATIONS

Sato et al. "High temperature oxidation of hot-pressed aluminium nitride by water vapour" Jour. Mat. Sc. 22, 1987 pp. 2277–2280.

Iwase et al., "Thick Film and Direct Bond Copper Forming Technologies for Aluminum Nitride Substrate", Jun. 1985, pp. 253–258 of IEEE Transactions on Components, Hybrids and Manufacturing Technology, vol. CHMT-8 No. 2.

Kuromitsu et al., "Surface Treatment of AlN Substrate", 1989, International Society for Hybrid Microelectronics.

*Primary Examiner*—Archene Turner
*Attorney, Agent, or Firm*—Rogers & Killeen

[57] ABSTRACT

A process for direct bonding a copper film to an yttria-doped aluminum nitride substrate comprises treating the substrate by preoxidation at elevated temperature to create an overlying thin film of $Al_2O_3$, followed by step cooling to a lower temperature. A copper foil of thickness between 1.0 and 4.0 microns and generally perforated or otherwise foraminous, is eutectically direct bonded to the substrate by the known direct bond copper (DBC) process. The resultant article exhibits high thermal conductivity, low permittivity and high mechanical strength. The peel strength of the copper film on the AlN substrate exceeds the peel strengths previously attainable in the industry.

22 Claims, No Drawings

DIRECT BONDING OF COPPER TO ALUMINUM NITRIDE SUBSTRATES

RELATED APPLICATIONS

This application is related to patent applications Ser. Nos. 07/454,547 and 07/454,548, both filed Dec. 21, 1989 by H. F. Webster et al. The former application is entitled "ENHANCED DIRECT BOND COPPER PROCESS AND STRUCTURE" and relates to the field of metal bonds, and more particularly, to the field of direct (metal-metal compound eutectic) bonds. The latter is entitled "CERAMIC-TO-CONDUCTING-LEAD HERMETIC SEAL" and relates to the field of electronic packagings and, more particularly, to hermetically sealed electronic packages in which alumina or beryllia substrates are bonded with copper through use of a copper oxide eutectic. Another related application, Ser. No. 07/603,495), filed on Oct. 26, 1990, is entitled "DIRECT THERMOCOMPRESSION BONDING TECHNOLOGY FOR THIN ELECTRONIC POWER CHIP PACKAGES" by C. A. Neugebauer et al. and is illustrative of techniques for use of direct bond copper on highly thermally conducting ceramics. All of the aforementioned applications are incorporated herein by reference.

BACKGROUND OF THE INVENTION

1. Field of the Invention

The present invention relates generally to direct bonding of copper on ceramic substrates and, more particularly, to the direct bonding of copper on aluminum nitride.

2. Background Information

It has been determined that aluminum nitride (AlN), when sufficiently pure, has a thermal conductivity which is near that of beryllia (BeO). This characteristic makes aluminum nitride a most desirable dielectric for use as a substrate where thermal resistance of the package is a limiting factor. Further, aluminum nitride has a temperature coefficient of expansion (TCE) close to that of a silicon (Si) chip and possesses a thermal conductivity, as previously indicated, approximately ten times that of alumina.

Before a ceramic substrate may be used in the assembling of power devices, it must first be provided with a highly conductive metallization. Normally, copper is chosen for this metallization, in the thickness range of 0.010–0.020 inches. The use of copper metallization in this fashion ensures low electric resistive losses. Direct bonding of metal to ceramic substrates has been known for some time. A significant number of patents have been issued on the subject of direct bond copper (DBC) on ceramic substrates, most notably on alumina or beryllia. See, for example, D. A. Cusano et al. U.S. Pat. No. 3,994,430, "DIRECT BONDING OF METALS TO CERAMICS AND METALS", issued Nov. 30, 1976 and G. L. Babcock et al. U.S. Pat. No. 3,766,634, "METHOD OF DIRECT BONDING METALS TO NON-METALLIC SUBSTRATES", issued Oct. 23, 1973, both of which are hereby incorporated by reference. DBC on aluminum nitride has been used by the Toshiba Corporation in its line of power modules. More recently, a paper by Kuromitsu et al. of the Mitsubishi Metal Corporation, in the publication of the International Society for Hybrid Microelectronics (ISHM)) 1989, entitled "Surface Treatment of AlN Substrate", discusses a metal bond-enhancing surface treatment for AlN substrate. Iwase et al. of the Toshiba Research and Development Center in the publication of the IEEE Components, Hybrids, and Manufacturing Technology, Vol. CHMT-8, No. 2, June 1985, pp 253–258 present a paper entitled "Thick Film and Direct Bond Copper Forming Technologies for Aluminum Nitride Substrate" which relates a certain degree of success in applying DBC technique to a lightly doped (3% yttria) AlN sintered substrate. AlN is one of the most promising candidates as a highly thermally conductive substrate for semiconductor devices. Kuromitsu et al. and Iwase et al. propose a surface treatment for an AlN substrate that would make it suitable to receive most thick film materials that are now used on $Al_2O_3$ (alumina) substrates. AlN, because of certain superior properties such as high thermal conductivity, low permittivity and high mechanical strength, is indeed a promising candidate as a replacement for alumina, and even beryllia (which is a relatively toxic substance) substrates, if the poor adhesion of films to AlN substrates can be overcome. The instant invention succeeds in overcoming this widely known limitation of metal bonding to an aluminum nitride substrate by providing a method of controlled conversion of AlN to $Al_2O_3$ to obtain a thin stratum of the oxide on the nitride.

Before discussing the Kuromitsu et al. and Iwase et al. techniques, it is necessary to address recent developments in the preparation of AlN substrates. A cheaper version of AlN of somewhat higher thermal resistivity, but still several times lower than that of alumina, has recently been achieved. The newer AlN is sintered, and is correspondingly doped with a large fraction (up to 10%) of yttria which acts as a sintering aid in the fabrication of the substrate. Although resulting in a strong substrate which possesses most of the aforementioned enhanced properties, it has been established that the direct bonding process, most notably DBC, is unsatisfactory under certain conditions; moreover, the earlier published Toshiba recipe, although scrupulously followed, does not result in adherent copper films.

An adherent copper (or metal) film, as the term is used herein, means one which has high peel strength when applied on the desired or preferred dielectric substrate. Further, the entire ensemble should possess the high thermal conductivity necessary for dissipation of heat in electronic power modules. Optimally, direct bonded copper (DBC) on beryllia adequately fulfills these criteria; however, unencapsulated beryllia is sometimes considered too toxic for consumer applications. The next favored structure is DBC on AlN, a combination which results in good thermal conductivity but very poor peel strength, as pointed out in the Kuromitsu et al. paper. The least desirable of all the metallized structures is metallization (typically Cu) on $Al_2O_3$. This latter combination exhibits high peel strength, but possesses poor thermal conductivity with DBC. In fact, the thermal conductivity tradeoff (for the high peel strength) is a loss so great that, in situations requiring good thermal conductivity, use of one of the first mentioned structures is compelling. Since the use of beryllia is preferably avoided in certain applications because of the toxicity question, the DBC as taught herein constitutes a significant improvement over the Toshiba and Mitsubishi AlN substrates relative to the adherence of thin films of copper thereto. More specifically, the pre-treatment of the new yttria-doped AlN substrate that is set forth herein results in optimum adhesion when undergoing the DBC process set forth in the aforementioned Babcock et al. patent, for example.

The surface treatment of AlN substrates by Kuromitsu et al. and Iwase et al. comprises, generally, formation of an Al$_2$O$_3$ layer on the surface of AlN substrate. Although the Kuromitsu et al. technique also includes mixing alumina with certain glasses, they nevertheless report obtaining sufficient bonding strengths, and, by use of SiO$_2$, they achieve excellent bond strength. It was observed by Kuromitsu et al. that, when the Al$_2$O$_3$ layer is thin, a thicker SiO$_2$ layer is required to obtain this excellent bond strength. They conclude with the statement that the desirable thickness of Al$_2$O$_3$ is thought to be "5 to 8 $\mu$m" in order to retain the excellent thermal conductivity of the AlN substrate. Unfortunately, reliance on the various glasses used in the Kuromitsu et al. process is not always desirable and, even worse, appears to result in a loss in thermal conductivity of the AlN substrate and an increase in outgassing, caused initially by dissolution of the melt glass into the AlN substrate. Thus, by using the published Kuromitsu et al. process, loss of ultimate peel strength is encountered, induced by increased outgassing.

As hereinafter discussed, the instant process for effecting a DBC on aluminum nitride includes a pretreatment of the aluminum nitride that is superior to the Toshiba and Mitsubishi teachings and overcomes the previously mentioned limitations of the technology. The doped AlN has strength superior to intrinsic AlN (substrate) because the yttria enhances sintering of the AlN (powder) used to fabricate the substrate. As a consequence, glasses are not required for good adhesion strength and a thinner Al$_2$O$_3$ layer (not susceptible to crazing or cracking) permits easier eutectic bonding and provides higher thermal conductivity.

BRIEF SUMMARY OF THE INVENTION

It is generally known that a metal film cannot be bonded to a ceramic substrate unless oxygen is present; that is, without oxygen, generally present as the metal oxide, there can be no eutectic process. Likewise, copper cannot "wet" a ceramic of aluminum nitride unless some form of oxygen is present. In the aforementioned Toshiba process, aluminum nitride is oxidized by lengthy heating in a steam atmosphere. Thus the copper film is bonded to a substrate of Al$_2$O$_3$ which is "grown" on the surface of the aluminum nitride substrate. The Toshiba and Mitsubishi research, however, is unsuitable for the purposes for which the instant invention is required. AlN is softer than most sintered oxide substrates. Poor adherence of Al$_2$O$_3$ to intrinsic AlN substrates often compounds the problem of metal (foil) peeling from the Al$_2$O$_3$ that is generally caused by either outgas blistering of the foil or delamination from a crazed (largely cracked) Al$_2$O$_3$ layer. Use of glasses (SiO$_2$, PbO) strengthens the Al$_2$O$_3$ layer, but does little for the unreinforced AlN substrate. Further, outgassing can actually be increased, as pointed out by Kuromitsu et al. In arriving at the present invention, it was realized that a stronger AlN substrate could obviate need for a thick Al$_2$O$_3$ layer and for use of glassy additives with their concomitant increase in outgassing. A thinner layer is also less susceptible to crazing or cracking and is better for good thermal conductivity also.

Quite unexpectedly, it was found that it is possible to achieve optimum processing conditions in which the peel strength of the DBC foil on the aluminum nitride substrate exceeds 14 pounds per inch (measured across the width of the sample), thus overcoming the low-peel strength problem previously associated with doped AlN. These optimum conditions, for the yttria-doped AlN, involve oxidizing the nitride surface for 30 minutes at 1220° C. in an atmosphere of N$_2$/O$_2$, 10:1 by volume, in the presence of water vapor. In the subsequently performed DBC operation, a perforated foil is used to prevent blistering in the film caused by any latent or spurious outgassing from the preoxidized AlN substrate. In lieu of the perforated copper film, the various earlier techniques for avoiding delamination due to outgassing or other thermal stress can also be used, such as the "lacy" construction of thermal compression bonded films described in application Ser. No. 07/603,495 or the grooving techniques disclosed in U.S. Pat. No. 4,409,2278, issued on Oct. 11, 1983 to Eric P. Jochym and entitled "BLISTER-FREE DIRECT BONDING OF METALS TO CERAMICS AND METALS".

DETAILED DESCRIPTION OF THE INVENTION

Intrinsic AlN is doped with up to 10% yttria in order to effect a strong substrate by sintering. A pretreatment is then conducted on the AlN substrates by first establishing the proper gaseous mixture for an environment in which to conduct the oxidation of the aluminum nitride. A mixture of 0.3 SCFH (cubic feet per hour at standard conditions) of oxygen gas and 3.0 SCFH of nitrogen gas (O$_2$:N$_2$=1:10) flowed together, is supplied to a water baffle which is adjacent a conventional tube furnace and which is held at room temperature. In establishing these conditions, it has been determined empirically that a higher oxygen amount would produce too rapid an oxidation reaction, and vice versa. A water-bubbled mixture of the aforementioned gas constituents is then introduced to the furnace which has an open end at the side opposite the point of introduction. Initial flow of the gas mixture to the water baffle controls the water vapor in the furnace chamber thereafter.

The temperature of the furnace is initially set to a temperature regime of 1200° C. to 1250° C. in order to establish the temperature initial conditions (T$_{ic}$). After the temperature stabilizes, samples (i.e., various substrates) are loaded into a quartz carrier (i.e., boat) and inserted into the quartz tube that passes through the furnace. Oxidation time is measured from the time the furnace temperature is reestablished, following specimen loading at T$_{ic}$.

It has been further determined that optimum time-temperature process conditions for oxidation are 30 minutes at 1220° C. Oxidation time may vary, depending on temperature. Overoxidation at a higher temperature or longer time creates a thicker alumina surface on the AlN substrate, resulting in surface cracks which will inevitably prevent good adhesion of copper films on the AlN. Subsequently, upon removal from the furnace, the specimens are allowed to step cool in order to avoid chill-induced cracking or crazing in the newly created alumina surface, due to a mismatch in temperature coefficient of expansion between AlN and Al$_2$O$_3$. This step cooling may be performed by moving the sample from a central location in the furnace to a location in the furnace that is near the edge of the furnace (so as to reside at an ambient temperature of over 700° C.) for a period of about 3-5 minutes, until the sample has changed in color from orange to gray. At this time the sample can be relocated outside of the furnace and allowed to cool for a period of about 3 minutes. The sample is then removed from the quartz tube. To achieve maximum adhesion, all conditions are carefully controlled to create an alumina surface thickness on the AlN ranging from 1–4 microns, with an optimum (for obtaining very high peel strength) being between 2 and 3 microns, and most preferably 2 microns.

After the alumina-layered AlN substrates are prepared and cooled, DBC processing is conducted on them using a perforated copper foil in order to prevent foil blistering which might be caused by outgassing from the AlN substrate. Alternatively, lacy construction, as taught in application Ser. No. 07/603,495 or surface modification (grooving) as taught in U.S. Pat. No. 4,409,278 may be effected, resulting in the same favorable adhesion characteristics exhibited by the perforated copper foil. Analysis has shown the peel adhesion strength of 5 mil thickness copper foil on AlN to be 14.5 pounds per inch, which is almost 80% of the peel strength of direct bonded copper to alumina.

The table below indicates the adhesion strength of copper films on standard 2"×2" 50 mil thick yttria doped AlN substrates purchased from Carborundum Company, Electronic Materials Group, Substrates Division, 2050 Cory Drive, Sanborn, N.Y. 14132, at the various AlN surface treatment conditions. At the maximum adhesion condition, the observed thickness of the surface alumina is 2.0 microns, significantly thinner than either of the 5.0–8.0 microns reported in the aforementioned Kuromitsu et al. paper, or the 4.0 microns reported in the aforementioned Iwase et al. paper and attained only as a result of direct bonding Au to AlN through use of other metallics. Thus high peel strength is acquired without use of additional metallics and is consistent with the uncrazed, sparser and thinner $Al_2O_3$ lamina achieved by the invention. This new laminate demonstrates that the thermal conduction of AlN dominates the $Al_2O_3$, achieving a metallized ceramic substrate not quite possessing all the attributes of DBC-on-beryllia, but of significantly better thermal character than either of the prior known DBC-on-AlN or DBC-on-alumina. Also significant is the fact that the present invention realizes a combination of highly conductive metallization-on-ceramic which exhibits high thermal conductivity, low permittivity and, because of the increased yttria doping of the AlN, high mechanical strength.

The following table details more extensively the empirical results of the invention:

| Table Of Peel Strength Of Copper Film (5 mil Thickness) That Has Been Applied By DBC On Preoxidized Yttria-Doped AlN Substrates At Specific Conditions | |
|---|---|
| Conditions | Peel Strength (lbs./in.) |
| As-received | 1.2 |
| $1\ O_2 + 100\ N_2$ (1:100) | |
| 1220° C./1 hr. | 3.7 |
| 1220° C./16 hrs. | 3.9 |
| 1250° C./1 hr. | 9.2 |
| $10\ O_2 + 100\ N_2$ (1:10) | |
| 1170° C./1 hr. | 10.0 |
| 1190° C./25 mins. | 10.4 |
| 1190° C./45 mins. | 10.1 |
| 1220° C./10 mins. | 2.9 |
| 1220° C./20 mins.* | 11.7 |
| 1220° C./25 mins.* | 12.0 |
| 1220° C./30 mins.* | 14.5 |
| 1220° C./35 mins. | 9.1 |
| 1220° C./40 mins. | 7.2 |
| 1220° C./1 hr. | 7.4 |
| 1250° C./10 mins.* | 11.3 |
| 1250° C./15 mins. | 8.6 |
| 1250° C./20 mins. | 7.7 |
| 1250° C./1 hr. | 5.7 |
| $20\ O_2 + 100\ N_2$ (1:5) | |
| 1220° C./10 mins. | 7.7 |
| 1220° C./20 mins. | 9.8 |
| 1220° C./30 mins. | 8.6 |
| 1220° C./1 hr. | 6.1 |
| 1250° C./10 mins.* | 11.6 |
| 1250° C./20 mins.* | 10.0 |
| Pure $O_2$ | |
| 1250° C./10 mins. | 9.6 |
| 1250° C./20 mins. | 6.1 |
| 1250° C./30 mins.* | 10.3 |
| 1250° C./40 mins. | 4.6 |
| Air ($O_2:N_2 \approx 1:4$) | |
| 1250° C./30 mins.* | 11.8 |
| 1250° C./1 hr. | 5.5 |
| 1250° C./1.5 hrs. | 12.8 |
| For comparison purposes: | |
| Alumina substrate | 18.4 |

*regime of consistently optimal results

It may be seen from the above data that optimum results of 14.5 lb/in. peel strength are achieved at 1220° C. with a treatment time of 30 mins., in an atmosphere of water vapor and $O_2:N_2$ in a ratio of 1:10. A desired surface texture of the deposited alumina that could best be described as "spongy", i.e., elastic and with a porous property that provides a good bonding interface, is achieved, thus effecting a surface modification analogous to the "grooving" of Jochym ('278). The spongy characteristic derives from a hydration of the alumina which varies in dependence upon the amount of water present in the reaction gas mixture. Thus the strength of the bond depends on the $Al_2O_3$ properties, thickness and texture, in a particular type of surface layer which is attained on an AlN substrate by the instant process. The required thickness of the $Al_2O_3$ layer is achieved only under the carefully controlled conditions discussed herein, and as noted in the above table.

In an alternative embodiment for producing the AlN substrates coated with 2.0 microns thickness of alumina to undergo DBC, yttria-doped AlN substrates are loaded into a Pyrogenic steam furnace at a temperature of 700° C. in a nitrogen and oxygen atmosphere maintained at a flow rate of 1 liter(l)/min. $O_2$ and 8 l/min. $N_2$. Furnace temperature is then ramped up to about 1150° C. in 1 hour. The furnace atmosphere is then stabilized to pure $O_2$, and a steam environment is next created by introducing $O_2$ at a 2 l/min. flow rate and $H_2$ at a 3.5 l/min. flow rate. The samples are held in the steam environment for about 1 hour. The $H_2$ flow is then shut off and the $O_2$ flow is increased to a 4 l/min. rate for 5 minutes to drive off the $H_2$. The samples are next step cooled to about 700° C. in 2 hours in a nitrogen atmosphere maintained by a nitrogen flow rate of 8 l/min., and then allowed to cool to room temperature. An AlN substrate fabricated in this manner has been found to exhibit a 14 lb./in. peel strength for copper film of 5 mils thickness.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for direct bonding a high peel-resistant metal conductive film to a yttria-doped aluminum nitride substrate comprising:
   (a) preoxidizing said substrate by heating said substrate to a temperature of between 1200° and less than about 1250° C. for between 10 and 30 minutes in an atmosphere of water vapor and a mixture of nitrogen and oxygen in a ratio of 10:1 to 4:1 to create thereon a uniform layer of $Al_2O_3$ of thickness between 1.0 and 4.0 microns;
   (b) step cooling said substrate;
   (c) direct bonding a perforated, grooved or lacy copper film to said layer of a $Al_2O_3$ by forming a copper-copper oxide eutectic in situ from said copper film.

2. The method of claim 1 wherein said step cooling is performed in atmosphere.

3. The method of claim 1 wherein the layer of $Al_2O_3$ is between 2 and 3 microns in thickness.

4. The method of claim 3 wherein said step cooling is performed in atmosphere.

5. The method of claim 1 wherein the layer $Al_2O_3$ microns thick.

6. The method of claim 5 wherein said step cooling is performed in atmosphere.

7. The method of claim 1 wherein the ratio is about 10:1.

8. The method of claim 7 wherein the temperature is about 1220° C.

9. The method of claim 8 wherein the time is about 20 to 30 minutes.

10. The method of claim 1 wherein the ratio is 5:1 to 10:1.

11. The method of claim 10 wherein the time is about 10 to 20 minutes.

12. The method of claim 1 wherein the copper film is perforated.

13. A method for obtaining peel resistant direct metal bonds on an aluminum nitride substrate comprising pretreating the substrate by slowly oxidizing it in an atmosphere of water vapor and $N_2:O_2$ mixture in the range of about 10:1 to about 4:1 for between 10 and 30 minutes at a temperature in the range of 1200° C. to less than about 1250° C., step cooling the oxidized substrate, and eutectically direct bonding thereon a perforated, ground or lacy copper foil.

14. The method of claim 13 wherein the pretreating step comprises oxidizing the substrate slowly until an $Al_2O_3$ layer between 2 and 3 microns in thickness is formed thereon with a surface texture conductive to direct bonded copper adherence.

15. The method of claim 13 wherein the pretreating step comprises oxidizing the substrate slowly until an $Al_2O_3$ layer 2 microns in thickness is formed thereon with a surface texture conductive to directed bonded copper adherence.

16. The method of claim 13 wherein the $N_2:O_2$ mixture ratio is about 10:1.

17. The method of claim 16 wherein the temperature is about 1220° C.

18. The method of claim 17 wherein the time is about 20 to 30 minutes.

19. The method of claim 13 wherein the $N_2:O_2$ mixture ratio is 5:1 to 10:1.

20. The method of claim 19 wherein the time is about 10 to 20 minutes.

21. The method of claim 13 wherein the $N_2:O_2$ mixture is greater than the $N_2:O_2$ mixture of air.

22. The method of claim 13 wherein the copper foil is perforated.

* * * * *